United States Patent
Sanders et al.

(10) Patent No.: US 6,770,326 B2
(45) Date of Patent: Aug. 3, 2004

(54) HIGH THERMAL CONDUCTIVITY SPIN CASTABLE POTTING COMPOUND

(75) Inventors: Jason L. Sanders, Indianapolis, IN (US); George E. Sears, Indianapolis, IN (US)

(73) Assignee: Lord Corporation, Cary, NC (US)

( * ) Notice: Subject to any disclaimer, the term of this patent is extended or adjusted under 35 U.S.C. 154(b) by 0 days.

(21) Appl. No.: 10/190,110

(22) Filed: Jul. 3, 2002

(65) Prior Publication Data

US 2003/0050419 A1 Mar. 13, 2003

Related U.S. Application Data

(60) Provisional application No. 60/302,711, filed on Jul. 3, 2001.

(51) Int. Cl.[7] ............................. B05D 3/02; C08L 83/00
(52) U.S. Cl. ..................... 427/387; 524/404; 524/428; 524/430; 524/432; 524/437; 524/588; 528/31; 528/32
(58) Field of Search ................................ 524/404, 428, 524/430, 432, 437, 588; 528/31, 32; 427/387; 252/71

(56) References Cited

U.S. PATENT DOCUMENTS

| | | | |
|---|---|---|---|
| 3,020,260 A | 2/1962 | Nelson | |
| 3,159,601 A | 12/1964 | Ashby | |
| 3,159,602 A | 12/1964 | Hamilton et al. | |
| 3,220,972 A | 11/1965 | Lamoreaux | |
| 3,377,432 A | 4/1968 | Abbott et al. | |
| 3,419,593 A | 12/1968 | Willing | |
| 3,715,334 A | 2/1973 | Karstedt | |
| 3,775,452 A | 11/1973 | Karstedt | |
| 3,814,730 A | 6/1974 | Karstedt | |
| 4,374,967 A | 2/1983 | Brown et al. | |
| 4,486,495 A * | 12/1984 | Matsushita et al. | 442/117 |
| 4,529,789 A | 7/1985 | Kroupa | |
| 4,600,261 A | 7/1986 | Debbaut | |
| 4,634,207 A | 1/1987 | Debbaut | |
| 4,777,063 A | 10/1988 | Dubrow et al. | |
| 5,011,870 A | 4/1991 | Peterson | |
| 5,021,494 A | 6/1991 | Toya | |
| 5,079,300 A | 1/1992 | Dubrow et al. | |
| 5,268,815 A | 12/1993 | Cipolla et al. | |
| 5,276,087 A | 1/1994 | Fujiki et al. | |
| 5,332,795 A | 7/1994 | Fujiki et al. | |
| 5,357,057 A | 10/1994 | Debbaut | |
| 5,552,635 A | 9/1996 | Kim et al. | |
| 5,571,853 A | 11/1996 | Ikeno et al. | |
| 5,812,374 A | 9/1998 | Shuff | |
| 5,818,564 A * | 10/1998 | Gray et al. | 349/161 |
| 6,069,201 A | 5/2000 | Okinoshima et al. | |
| 6,225,433 B1 | 5/2001 | Isshiki et al. | |
| 6,380,301 B1 * | 4/2002 | Enami et al. | 524/588 |

FOREIGN PATENT DOCUMENTS

| | | |
|---|---|---|
| EP | A-057459 | 2/1982 |
| EP | 188978 | 12/1985 |
| EP | A-190530 | 12/1985 |

* cited by examiner

Primary Examiner—Margaret G. Moore
Assistant Examiner—Marc S. Zimmer
(74) Attorney, Agent, or Firm—Miles B. Dearth

(57) ABSTRACT

Disclosed is a thermally conductive silicone gel is produced by reacting a stoichiometric excess of a multifunctional vinyl-substituted silicone with a multifunctional hydride-substituted silicone. The thermal conductive components comprise at least three conductive solid fillers, aluminum oxide, zinc oxide and boron nitride. The invention is adaptable to spin casting for encapsulating electronic circuitry, among other uses.

6 Claims, No Drawings

HIGH THERMAL CONDUCTIVITY SPIN CASTABLE POTTING COMPOUND

This application claims the benefit of Provisional Application No. 60/302,711, filed Jul. 3, 2001.

FIELD OF THE INVENTION

The invention is directed to addition-curable polysiloxane potting compounds used to encapsulate circuitry.

BACKGROUND OF THE INVENTION

A thermally conductive material is conventionally used to establish thermal contact between the heat sink and the heat-producing components and/or the circuit board. Illustrative disclosures relating to heat dissipation in circuit boards include Cipolla et al., U.S. Pat. No. 5,268,815 (1993); Kim et al., U.S. Pat. No. 5,552,635 (1996); and Shuff, U.S. Pat. No. 5,812,374 (1998).

The present invention is directed to addition-curable silicone gels and readily adapted as pottants and encapsulants for preserving and protecting delicate electronic circuitry in severe environments. Additional applications of silicone gels according to the present invention include optical joint sealants, optical waveguides, keyboard handrests, and clean room HEPA filter sealants. Conventional addition-curable silicone gel compositions comprising an alkenyl-containing polydiorganosiloxane polymer, an organohydrogenpolysiloxane, and a hydrosilylation catalyst are known in the art from U.S. Pat. No. 4,374,967 to Brown et al.; U.S. Pat. No. 4,529,789 to Kroupa; U.S. Pat. No. 5,332,795 to Fujiki et al.

Specifically, there is provide in the art crosslinked silicone prepared by the platinum-catalyzed reaction between a vinyl-functionalized PDMS and a hydride-functionalized PDMS. Gelest, Inc. produces commercial curing packages useful with polydimethylsiloxane. Such gels can be formed in a number of ways. One method synthesizes the crosslinked polymer in the presence of a non-reactive extender fluid, e.g. trimethylsiloxy-terminated PDMS. The method according to the present invention fabricates the silicone gel by reacting a stoichiometric excess of a multifunctional vinyl-substituted silicone with a multifunctional hydride-substituted silicone in such a fashion that a soft, fluid-extended system is obtained.

In the reaction of a multifunctional vinyl-substituted silicone with a multifunctional hydride-substituted silicone, a vinyl-rich sol fraction is obtained. Suitable examples of either of these gel systems are taught in, inter alia, Debbaut, U.S. Pat. No. 4,600,261 (1986); Debbaut, U.S. Pat. No. 4,634,207 (1987); Debbaut, U.S. Pat. No. 5,357,057 (1994); Dubrow et al., U.S. Pat. No. 5,079,300 (1992); Dubrow et al., U.S. Pat. No. 4,777,063 (1988); and Nelson, U.S. Pat. No. 3,020,260 (1962); the disclosures of which are incorporated herein by reference.

U.S. Pat. No. 5,571,853 to Ikeno et al. discloses a gel-forming silicone composition comprising (A) an organopolysiloxane containing a silicon-bonded alkenyl group or groups in an average amount of from 0.15 to 0.35 mol % based on all silicon-bonded organic groups contained per molecule, (B) a non-functional organopolysiloxane, (C) an organohydrogenpolysiloxane containing an average of 2 silicon-bonded hydrogen atoms per molecule, and (D) an addition reaction catalyst. The silicone composition is able to give a gel-like cured silicone product with low modulus of elasticity while retaining flexibility.

U.S. Pat. No. 6,225,433 discloses a curable silicon composition, comprising (A) 100 parts by weight of an organopolysiloxane containing silicon-bonded aryl groups and at least two alkenyl groups per molecule, and having a viscosity of from 0.01 to 1,000 Pa-s at 25° C., wherein the aryl groups comprise from 1 to 40 mole % of the total silicon-bonded organic groups in the organopolysiloxane; (B) an organopolysiloxane having a viscosity of from 0.001 to 10 Pa-sec. at 25° C. and containing at least 2 silicon-bonded hydrogen atoms per molecule, in a quantity sufficient to cure the composition; (C) a platinum catalyst in a quantity sufficient to cure the composition; and (D) 0.00001 to 100 parts by weight of an organopolysiloxane having a viscosity of from 0.01 to 10,000 Pa-s at 25° C. provided that when the organopolysiloxane contains aryl groups, the aryl groups comprise less than 1 mole % or more than 40 mole % of the total silicon-bonded organic groups in the organopolysiloxane. The organopolysiloxane cures to form a silicone having a complex modulus less than or equal to $1 \times 10^8$ Pa at $-65°$ C. and a shear frequency of 10 Hz or a cured silicone having a Young's modulus less than or equal to $2.9 \times 10^8$ Pa at $-65°$ C.

Thus, it is desirable to develop a potting compound for encapsulating circuitry having high thermoconductivity for dissipating heat and/or transferring heat to a heat sink, and away from the circuit assembly, while at the same time protecting the circuitry from mechanical stresses or avoiding the transmission of such stresses to the circuitry. A spin castable potting compound must be able to flow under its own weight when applied to a circuit module mounted on a turntable spinning at above 1000 rpm. The viscosity of a potting compound as measured by Brookfield DV-II, spindle 7 at 10 rpm after a 5-minute dwell of less than 150,000 cps.

Exemplary of the current state of the art, thermally conductive spin castable pottants exhibit a thermal conductivity of about 0.5 w/m°K. Higher thermal conductivity is desired.

In attempts to increase the amount of thermally conductive filler loadings an unacceptable rise in viscosity occurs which would prohibit the application of the spin casting method. Improved thermal conductivity in the use of high loadings of conductive filler in a spin castable composition is desired.

SUMMARY OF THE INVENTION

In a basic aspect of the invention a thermally conductive silicone gel is produced by reacting a stoichiometric excess of a multifunctional vinyl-substituted silicone with a multifunctional hydride-substituted silicone. The thermal conductive components are a combination of at least three conductive solid fillers, aluminum oxide, zinc oxide and boron nitride.

In another aspect of the invention there is provided a high thermal conductive spin castable potting compound embodied in a two-part addition-crosslinkable composition wherein a vinyl-terminated siloxane crosslinks with Si-bonded hydrogen (hydrosilylation) in the presence of a platinum catalyst and contains a combination of thermal conductive materials comprising aluminum oxide, zinc oxide and boron nitride, in the substantial absence of aluminum nitride, as specified hereinbelow. In an alternative aluminum oxide, zinc oxide, titanium dioxide and boron nitride comprise the thermal conductive fillers.

In another aspect there is provided a method for encapsulating circuitry, comprising the steps of spin casting a precured silicone composition, said composition comprises:

a mixture of a stoichiometric excess of a multifunctional vinyl-substituted silicone with a multifunctional hydride-substituted silicone together with alumina, zinc oxide and optionally boron nitride, wherein the precured pottant exhibits a Brookfield DVII (#7 spindle) 1/10 rpm of less than 250,000/175,000 cps at 25° C., a thermal conductivity of at least 2.75 to 4 W/mK and a Shore A hardness after curing of from 30 to 80.

DETAILED DESCRIPTION OF THE PREFERRED EMBODIMENTS

The spin castable potting compound components (A)–(F) are described hereinbelow.
(A) Alkenyl-terminated diorganopolysiloxane
(B) Crosslinker
(C) Electronegative group terminated PDMS
(D) Hydrosilylation catalyst
(E) Curing rate retarder
(F) Thermal conductive fillers (A) Alkenyl-Terminated Diorganopolysiloxane The alkenyl-terminated diorganopolysiloxanes are known and commercially available globally. Examples of alkenyl groups which may be bonded to the silicon atoms in component (A) include vinyl groups, allyl groups, butenyl groups and hexenyl groups. Preferably, these groups are vinyl groups. Examples of substituents other than alkenyl groups which may be bonded to the silicon atoms in component (A) include substituted or unsubstituted monovalent hydrocarbon groups, e.g., alkyl groups such as methyl groups, ethyl groups and propyl groups, etc.; aryl groups such as phenyl groups and tolyl groups, etc.; and halogenated alkyl groups such as 3,3,3-trifluoropropyl groups, etc. The polymer may also contain extremely small amounts of hydroxy groups, as well as alkoxy groups such as methoxy groups, etc. The preferred vinyl content is from 0.3 to 0.6, preferably from 0.3 to 0.45 mol %. Commercial alkenyl-terminated diorganopolysiloxanes are available for example VS-50 and VS-100 from Hanse-Chemie. Ethylenically-unsaturated organopolysiloxanes and organohydrogenpolysiloxanes are taught in U.S. Pat. Nos. 3,159,662; 3,220,972; and 3,410,886. Preferred ethylenically-unsaturated organopolysiloxanes are those containing higher alkenyl groups such as those described by Keryk et al., U.S. Pat. No. 4,609,574. Specific examples include siloxane polymers of vinyltrimethoxysilane, vinyltriethoxysilane, vinyltri-n-propoxysilane, vinyltri-iso-propoxysilane, vinyltri-n-butoxysilane, vinyltri-sec-butoxysilane, vinyltri-tert-butoxysilane, vinyltriphenoxysilane. The disclosures of these references with respect to the ethylenically-unsaturated organopolysiloxane base polymers and organohydrogenpolysiloxane crosslinking agents disclosed therein are incorporated herein by reference.

(B) Crosslinker

The crosslinker is a hydrogen-functionalized (e.g. hydride-terminal) organopolysiloxane having a viscosity between 1 and 1,000,000 cP at 25.degree. C. and containing an average of at least 2 silicon-bonded hydrogen atoms per molecule, in a quantity that provides between 0.2 and 5.0 moles of silicon-bonded hydrogen per mole of silicon-bonded alkenyl in the alkenyl-functionalized diorganopolysiloxane (i). Hydride-terminated organopolysiloxane is commercially available from OSI, Inc. under the VXL designation.

The crosslinker may be a relatively low-molecular-weight H-functional oligosiloxane, such as tetramethyldisiloxane, or a highly polymeric polydimethylsiloxane having SiH groups positioned along the chain or terminally, or a silicone resin having SiH groups. The structure of the molecules forming the crosslinker may vary. In particular, the structure of a higher-molecular-weight, i.e. oligomeric or polymeric, SiH-containing siloxane may be linear, cyclic, branched or else resin-like or network-like. Linear and cyclic polysiloxanes are preferably composed of units of the formula $R_3SiO_{1/2}$, $HR_2SiO_{1/2}$, $HRSiO_{2/2}$ and $R_2SiO_{2/2}$, where R is as defined above. Branched and network-like polysiloxanes additionally contain trifunctional and/or tetrafunctional units, preferably those of the formulae $RSiO_{3/2}$, $HSiO_{3/2}$ and $SiO_{4/2}$. It is, of course, also possible to use mixtures of different siloxanes meeting the criteria for the crosslinker (B). In particular, the molecules forming crosslinker (B) may, in addition to the obligatory SiH groups, if desired at the same time also contain aliphatic unsaturated groups. Particular preference is given to the use of low-molecular-weight SiH-functional compounds, such as tetrakis (dimethylsiloxy)silane and tetramethylcyclotetrasiloxane, and also high-molecular-weight SiH-containing siloxanes, such as poly(hydromethyl)siloxane and poly(dimethylhydromethyl)siloxane with a viscosity of from 10 to 10,000 mPa·s at 25° C., or analogous SiH-containing compounds in which some of the methyl groups have been replaced by 3,3,3-trifluoropropyl or phenyl groups.

(E) A Curing Rate Retarder

The cure rate of the potting compound must be moderated. Suitable retarding moderators include acetylene compounds; organo-phosphorus compounds or polyvinyl siloxanes, etc. The preferred retarder is a homopolymer of vinyl methyl siloxane, commercially available as VMS T-11, from Gelest, Inc..

Preferred Components

In a preferred embodiment, the curable pottant exhibits a Brookfield DVII (#7 spindle) 1/10 rpm of 250,000/75,000 cps at 25° C., a thermal conductivity of at least 2, preferably 2.75 to 4 W/mK and a Shore A hardness after curing of from 30 to 80, and comprising, In preference, (A) is an alkenyl-terminated diorganopolysiloxane usable herein will exhibit a Brookfield LVF viscosity of between 50 and 100,000 cP at 25° C. and contain at least two silicon-bonded alkenyl groups in each molecule. Preferably the viscosity ranges from 50 to 200 cps at 25° C. at 99% solids;

In preference, (B) as crosslinker will comprise a hydrogen-functionalized organopolysiloxane having a viscosity between 1 and 100 Centistokes at 25° C. and contain an average of at least 2 silicon-bonded hydrogen atoms per molecule, in a quantity that provides between 0.2 and 5.0 moles of silicon-bonded hydrogen per mole of silicon-bonded alkenyl-functionalized diorganopolysiloxane;

In preference, (C) the electro-negative group terminated siloxane oligomers contain an electro-negative substituent in the terminating portion of the oligomeric compound include dimethylacetoxy-terminated polydimethylsiloxanes (PDMS), methyidiacetoxy-terminated PDMS, dimethylethoxy-terminated PDMS, aminopropyldimethyl-terminated PDMS, carbinol-terminated PDMS, monocarbinol-terminated PDMS, dimethylchloro-terminated PDMS, dimethylamino-terminated PDMS, dimethylethoxy-terminated PDMS, dimethylmethoxy PDMS, methacryloxypropyl-terminated PDMS, monomethylacryloxypropyl-terminated PDMS, carboxypropyldimethyl-terminated PDMS, chloromethyidimethyl-terminated PDMS, carboxypropyidimethyl-terminated PDMS and silanol-terminated polymethyl-3,3,3-trifluoropropylsiloxanes with monocarbinol-terminated PDMS being preferred. Electronegative group terminated siloxane oligomers are available form Gelest, Inc. under the MCR C-22 designation.

(D) Catalyst

The catalyst is a typical platinum hydrosilylation catalyst and used in an amount specified below which is sufficient to effect the cure of the silicone composition. Suitable platinum catalyst is available form Gelest, Inc. under the SIP 6830 designation.

(F) Thermal Conducting Fillers.

Thermally conductive fillers are used at from 50–92%, preferably from 80–92% by volume of a combination comprising aluminum oxide, zinc oxide, and boron nitride in one embodiment. In a preferred embodiment the thermal conductive fillers comprise aluminum oxide, zinc oxide, titanium dioxide and boron nitride.

The thermally conductive materials, alumina, zinc oxide, titanium dioxide and boron nitride are widely available in industry. Alumina, available as alpha alumina has a percent retained on 200 mesh screen of 0.2%, and a 95% pass through at 325 mesh screen. With respect to each thermal conductive filler, there is preferably 40–65 vol. % of aluminum oxide is used together with from 5–25 vol. % of zinc oxide, and from 1.2–5 vol. % of boron nitride. The preferred amount of aluminum 55–65 vol. % of aluminum oxide. The preferred amount of zinc oxide is from 5–10 vol. %. The preferred amount of titanium dioxide is from 6–12%. A preferred amount of boron nitride is from 1.2–5 vol. %.

Aluminum oxide is available from Whittaker Clark and Daniels. Zinc oxide is available form Zinc Corp. of America as USP-2 grade. Titanium dioxide is available from Dupont under the Tipure® R-900. Boron nitride is available from Advanced Ceramics under the PT 110-S designation.

In a more preferred embodiment, the thermal conductive fillers comprise 55–65 vol. % of aluminum oxide, from 5 to 10 vol. % of zinc oxide, from 6 to 12 vol. % of titanium dioxide and from 1.2–5 vol. % of boron nitride.

The preferred total volume percent of thermal conductive fillers comprising aluminum oxide, zinc oxide, and boron nitride is from 65–70 vol. %.

The preferred total volume percent of thermal conductive fillers comprising aluminum oxide, zinc oxide, titanium dioxide and boron nitride is from 80–92 vol. %. At this filler loading a surprising result is that the viscosity of the precured potting compound is in a flowable range, that can flow under only the centrifugal force from a spin casting turntable, enabling the potting compound to encapsulate the part to be coated.

The potting compound may preferredly further include an organosiloxane resin other than an alkenyl-functional siloxane. The organofunctional siloxanes may be partially or completely hydrolyzed silanes. These provide viscosity control, wetting of fillers and to the substrate. The weight % is based on the amount of the organosiloxane resin plus (A) alkenyl-functionalized diorganopolysiloxane (B) and hydrogen-functionalized organopolysiloxane.

Optionally and preferredly the ethylenically-unsaturated organopolysiloxanes or organohydrogenpolysiloxanes are present along with other silanes or siloxanes absent ethylenic unsaturated group. These are groups such as epoxy-, hydroxy, and alkyl-, halo-, aryl-functional silanes and siloxanes. A representative organosilane is propyltrimethoxysilane, such as Dynasylan® PTMO. from Deciussa (Sivento).

The epoxy-substituted organosilanes are adaptable and are present as silane or a polyorganosiloxane and contain at least one epoxy group and a hydrolyzable group, each bonded to a silicon atom. The epoxy group is bound by means of an alkylene radical containing at least 1 carbon atom. Alternatively, the epoxide group can be part of a carbocyclic ring that is bonded to a silicon atom through an alkylene group. A preferred silane is represented by the formula $R^1$—Si—$R^2$m-$R^{3-m}$ where $R^1$ represents an epoxyalkyl radical or an epoxy-substituted cycloalkyl radical, $R^2$ represents an alkyl radical, $R^3$ represents a hydrolyzable group and m is 0 or 1. Examples of suitable hydrolyzable groups represented by $R^3$ include but are not limited to alkoxy, carboxy, i.e. R'C(O)O—— and ketoximo. In preferred embodiments the hydrolyzable groups are alkoxy groups containing from 1 to 4 carbon atoms.

Numerous epoxy-functional silanes are described in U.S. Pat. No. 3,455,877, which is incorporated herein by reference. Specific examples of epoxy-functional silane are mono (epoxyhydrocarbyl) trialkoxysilane wherein the carbon atoms of the epoxy group are separated form the silicon atom by an alkylene radical. One example is 3-glycidoxypropyltrialkoxysilane where the alkoxy group is methoxy or ethoxy.

Representative hydroxyl group-containing silanes are also adaptable herein have the general structure:

(A)

wherein R in all instances herein is a divalent aliphatic, cycloaliphatic or aromatic saturated or unsaturated radical having from 1 to 20 carbon atoms, and is preferably an alkylene radical having from 1 to 9, most preferably 2 to 4 carbon atoms; $R^1$ is a monovalent aliphatic, cycloaliphatic or aromatic radical having from 1 to 20 carbon atoms, and is preferably selected from the group consisting of alkyl radicals having from 1 to 4 carbon atoms, cycloalkyl radicals having from 4 to 7 ring carbon atoms, and aryl radicals having 6, 10, or 14 nuclear carbon atoms and including such aryl radicals containing one or more substituent alkyl groups having from 1 to 4 carbon atoms; $R^2$ is a monovalent aliphatic, cycloaliphatic or aromatic organic radical containing from 1 to 8 carbon atoms, and is preferably selected from the group consisting of alkyl radicals having from 1 to 4 carbon atoms, $R^3$—O—$R^4$,

and where $R^3$ is an alkylene group having from 1 to 4 carbon atoms (methyl, ethyl, propyl, butyl) and $R^4$ is an alkyl group having from 1 to 4 carbon atoms; and a is zero or 1, preferably zero.

Representative alkyl, halo- or aryl functional trialkoxysilanes include include: fluorotrimethoxysilane, fluorotriethoxysilane, fluorotri-n-propoxysilane, fluorotriisopropoxysilane, fluorotri-n-butoxysilane, fluorotri-sec-butoxysilane, fluorotri-tert-butoxysilane, and fluorotriphenoxysilane; methyltrimethoxysilane, methyltriethoxysilane, methyltri-n-propoxysilane, methyltri-iso-propoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltri-isopropoxysilane, ethyltri-n-butoxysilane, ethyltri-sec-butoxysilane, ethyltri-tert-butoxysilane, ethyltriphenoxysilane, n-propyltrimethoxysilane, propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-tert-butoxysilane, n-propyltriphenoxysilane, isopropyltrimethoxysilane, isopropyl triethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriethoxysilane, sec-butyltrimethoxysilane, sec-butyltriethoxysilane, sec-butyltri-n-propoxysilane, sec-butyltriisopropoxysilane, sec-butyltri-n-butoxysilane, sec-butyltri-sec-butoxysilane, sec-butyltri-tert-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-tert-butoxysilane, tert-butyltriphenoxysilane, phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-tert-butoxysilane, phenyltriphenoxysilane, γ-trifluoropropyltrimethoxysilane, and γ-trifluoropropyltriethoxysilane; dimethyldimethoxysilane, dimethyldiethoxysilane, dimethyidi-n-propoxysilane, dimethyidiisopropoxysilane, dimethyidi-n-butoxysilane, dimethyldi-sec-butoxysilane, dimethyldi-tert-butoxysilane, dimethyidiphenoxysilane, diethyldimethoxysilane, diethyldiethoxysilane, diethyldi-n-propoxysilane, diethyldiisopropoxysilane, diethyidi-n-butoxysilane, diethyidi-sec-butoxysilane, diethyldi-tert-butoxysilane, diethyldiphenoxysilane, di-n-propyldimethoxysilane, di-n-propyldiethoxysilane, di-n-propyidi-n-propoxysilane, di-n-propyldiisopropoxysilane, di-n-propyldi-n-butoxysilane, di-n-propyidi-sec-butoxysilane, di-n-propyidi-tert-butoxysilane, di-n-propyldiphenoxysilane, diisopropyldimethoxysilane, diisopropyldiethoxysilane, diisopropyidi-n-propoxysilane, diisopropyldiisopropoxysilane, diisopropyldi-n-butoxysilane, diisopropyldi-sec-butoxysilane, diisopropyidi-tert-butoxysilane, diisopropyldiphenoxysilane, di-n-butyldimethoxysilane, di-n-butyidiethoxysilane, di-n-butyidi-n-propoxysilane, di-n-butyldiisopropoxysilane, di-n-butyidi-n-butoxysilane, di-n-butyidi-sec-butoxysilane, di-n-butyldi-tert-butoxysilane di-n-butyldiphenoxysilane, di-sec-butyldimethoxysilane, di-sec-butyldiethoxysilane, di-sec-butyldi-n-propoxysilane, di-sec-butyldiisopropoxysilane, di-sec-butyldi-n-butoxysilane, di-sec-butyldi-sec-butoxysilane, di-sec-butyldi-tert-butoxysilane, di-sec-butyldiphenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyldi-tert-butoxysilane, di-tert-butyldiphenoxysilane, diphenyldimethoxysilane, diphenyldiethoxysilane, diphenyldi-n-propoxysilane, diphenyldiisopropoxysilane, diphenyldi-n-butoxysilane, diphenyldi-sec-butoxysilane, diphenyldi-tert-butoxysilane, and diphenyidiphenoxysilane.

Preferred alkyl trialkoxysilanes are methyltrimethoxysilane, methyltriethoxysilane, methyltri-n-propoxysilane, methyltriisopropoxysilane, ethyltrimethoxysilane, ethyltriethoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, and n-propyltri-tert-butoxysilane.

The curing catalyst (C) is a hydrosilylation catalyst. The catalyst contains at least one of the following elements: Pt, Rh, Ru, Pd, Ni, e.g. Raney Nickel, and their combinations. The catalyst is optionally coupled to an inert or active support. Examples of preferred catalysts which can be used include platinum type catalysts such as chloroplatinic acid, alcohol solutions of chloroplatinic acid, complexes of platinum and olefins, complexes of platinum and 1,3-divinyl-1,1,3,3-tetramethyldisiloxane. and powders on which platinum is supported, etc. The platinum catalysts are fully described in the literature. Mention may in particular be made of the complexes of platinum and of an organic product described in U.S. Pat. Nos. 3,159,601, 3,159,602 and 3,220,972 and European Patents EP-A-057,459, EP-188,978 and EP-A-190,530 and the complexes of platinum and of vinylated organopolysiloxane described in U.S. Pat. Nos. 3,419,593, 3,715,334, 3,377,432, 3,814,730, and 3,775,452, to Karstedt. In particular, platinum type catalysts are especially desirable. An exemplary commercially available platinum catalyst is SIP 6830, available from Gelest, Inc. In the use of a platinum type catalyst the amount of platinum metal of this catalyst that is contained is in the range of from 0.01 to 1,000 ppm (in weight units), with an amount of platinum metal in the range of 0.1 to 500 ppm being preferred, alternatively, in terms of volume percent to total components, catalyst amount can range from 0.0001 to 0.1 volume % of the potting compound.

Optionally up to 10 volume % preferably included in the potting compound is a dispersing agent (G) which is an oligomer of n-propyltrimethoxysilane (PTMO). Commercial PTMO is available from Degussa-Huls, under the DYNASYLAN® mark, in particular Dynasylan PTMO.

General Application Methods

The gel composition is soft, i.e., it has a Shore A hardness of from 25 to 85, preferably from 50 to 60, and as a preformed pad embodiment, has a compression modulus, of less than 2 MPa, preferably less than 1 MPa. Compression modulus is the modulus at 10% compression as measured per ASTM D 575 (1991), using a 25.4 mm (1 in.) disk, 3 mm thick, at 0.1 mm/min compression rate.

The gel precursor (procured compound) composition can be applied by conventional spin casting methods well known in the art to coat and encapsulate electronic circuitry. Alternatively, a pad of the potting compound may be applied by conventional printing processes such as gravure or flexographic printing or, alternatively, by methods which allow a thicker layer to be applied, such as screen printing or stencil printing, for example greater than 0.25 mm in thickness. A thicker layer may also be achieved by dispensing disconnected beads, lenses, ribbons, or dots of precursor composition which knit together during cure to form a continuous body of gel composition. A combination of dispensing and stencil printing may be employed to control final material size (area) and thickness.

The preferred embodiment is a two-part compound containing the parts as follows:

TABLE A

A-Side

| Chemical Description | Material | Manufacturer (Distributor) | Range (Vol %) |
|---|---|---|---|
| (1) Vinyl Terminated PDMS | (1) VS-100 | Hanse-Chemie (Anderson and Assoc, dist) | 20.0–65.0 |
| (2) Platinum Catalyst | (2) SIP 6830 Pt Catalyst | Gelest, Inc. | 0.0001–0.1 |
| (3) Monocarbinol terminated PDMS | (3) MCR C-22 | Gelest, Inc. | 0.0–10.0 |
| (4) Vinylmethyl siloxane homopolymer | (4) VMS T-11 Retarder | Gelest, Inc. | 0.0001–1.0 |
| (5) Propyltrimethoxysilane | (5) Dynasylan PTMO | Degussa-Huls | 0.0–10.0 |
| (6) Iron Oxide* | (6) Iron Oxide Kroma Red | Harcros Pigments Inc. (C.L. Zimmerman, dist) | 0.0–10.0 |
| (7) Aluminum Oxide | (7) T-64 | Alcoa (Whittaker, Clark and Danniels, dist) | 40.0–60.0 |
| (8) Boron Nitride | (9) Boron Nitride PT-110S | Advanced Ceramics Corp. | 1.2–5.0 |
| (9) Zinc Oxide | (8) USP-2 Zinc Oxide | Zinc Corp. of America | 10.0–20.0 |

*Optional coloring pigments are preferably used to color one of the A or B sides. Preferably iron oxide, such as available as Kroma Red, from Harcros Pigments Inc. is included the A-side.

TABLE B

B-Side

| | Material | Manufacturer | |
|---|---|---|---|
| (1) Vinyl Terminated PDMS | (1) VS-100 | Hanse-Chemie | 20.0–65.0 |
| (2) Monocarbinol terminated PDMS | (2) MCR C-22 | Gelest, Inc. | 0.0–10.0 |
| (3) Polydimethyl-methylhydrogen siloxane | (3) VX-L Crosslinker | OSI Specialties | 0.5–15.0 |
| (4) Propyltrimethoxysilane | (4) Dynasylan PTMO | Degussa-Huls | 0.0–10.0 |
| (5) Aluminum Oxide | (5) T-64 | Alcoa | 40.0–60.0 |
| (6) Zinc Oxide | (6) USP-2 Zinc Oxide | Zinc Corp. of America | 10.0–20.0 |
| (7) Boron Nitride | (7) Boron Nitride PT-110S | Advanced Ceramics Corp. | 1.2–5.0 |

Method To Make The Compound

Using a double Planetary mixer, the A-side is prepared by mixing the components from table A:

1) adding 1, 2, 3, 4, and 5 to a Ross® planetary mixer, and mixed for 5–10 min.
2) adding 6, and ⅓ of 7 and 8 to the mix and mixing for 10–15 min (at 30 RPM)
3) adding ⅓ of 7 and 8 to Ross, Mix 10–15 min. at 30 RPM)
4) add final ⅓ of 7 and 8 to Ross. Mix 30–35 min. at 30 RPM)
5) add 9, Mix 3–5 min to wet out, stop mixer, scrape blades
6) mix 60–65 min at <2 torr (at 30 RPM)
7) remove and package.

Using a double planetary mixer, the B-side is prepared by mixing the components from Table B:

1) adding 1, 2, 3, and 4 to Ross, mix 5–10 min
2) add ⅓ of 5 and 6 to Ross, Mix 10–15 min (at 30 RPM)
3) add ⅓ of 5 and 6 to Ross, Mix 10–15 min (at 30 RPM)
4) add final ⅓ of 5 and 6 to Ross. Mix 30–35 min (at 30 RPM)
5) add 7, Mix 3–5 min to wet out, stop mixer, scrape blades
6) mix 60–65 min at <2 torr (at 30 RPM)
7) Remove and package.

This potting compound is usable as a room temp stable two-component meter mixed potting compound. It exhibits a viscosity as measured by Brookfield DV-2, spindle 7 at 10 rpm after a 5 minute dwell of 140,000 cps.

Thermal Conductivity

Thermal conductivity was measured using a Mathis® Hot Disk thermal conductivity tester. Three tests were repeated for an example which contained The average of three runs was 2.98 W/mk, which was unexpected for a material that provided a spin castable viscosity and a Shore A hardness of 55.

What is claimed is:

1. A method for encapsulating circuitry, comprising the step of spin casting a silicone gel composition, said gel composition comprises:

a mixture providing a stoichiometric excess of alkenyl groups in a functionalized silicone to hydrosilyl groups in a hydrogen-functionalized organopolysiloxane, together with alumina, zinc oxide and boron nitride.

2. The method according to claim 1, wherein the gel composition has a bulk thermal conductivity greater than 2 W/mK.

3. The method according to claim 2, wherein the gel composition is made by the curing of said gel composition characterized by:

(A) an alkenyl-functionalized diorganopolysiloxane having a viscosity of between 50 and 100,000 cP at 25° C. and having at least two silicon-bonded alkenyl groups in each molecule; and (B) a hydrogen-functionalized organopolysiloxane having a viscosity between 1 and 1,000,000 cP at 25° C. and containing an average of at least 2 silicon-bonded hydrogen atoms per molecule;

(C) an electro-negative group terminated siloxane oligomers contain an electro-negative substituent in the terminating portion of the oligemeric compound;

(D) a hydrosilylation catalyst;

(E) a curing rate retarder, and (F) from 40–65 vol. % of aluminum oxide, 10–25 vol. % of zinc oxide, and 1.2–5 vol. % of boron nitride.

4. The method of claim 1 wherein said mixture further comprises titanium dioxide.

5. The method of claim 5 wherein the thermal conductive fillers are characterized by 55–65 vol. % of aluminum oxide, from 5 to 10 vol. % of zinc oxide, from 6 to 12 vol. % of titanium dioxide and from 1.2–5 vol. % of boron nitride.

6. An addition-crosslinkable precured potting composition comprising:

(A) an alkenyl-functionalized diorganopolysiloxane having a viscosity of between 50 and 100,000 cP at 25° C. and having at least two silicon-bonded alkenyl groups in each molecule and in a stoichiometric excess over (B); and (B) a hydrogen-functionalized organopolysiloxane having a viscosity between 1 and 1,000,000 cP at 25° C. and containing an average of at least 2 silicon-bonded hydrogen atoms per molecule, in a quantity that provides between 0.2 and 5.0 moles of silicon-bonded hydrogen per mole of silicon-bonded alkenyl in the alkenyl-functionalized diorganopolysiloxane (A);

(B) hydrosilylation catalyst, (C) an electro-negative group terminated siloxane oligomer containing an electro-negative substituent in the terminating portion of the oligomeric compound;

(D) a hydrosilylation catalyst;

(E) a curing rate retarder, and (F) from 4–65 vol. % of aluminum oxide, 10–25 vol. % of zinc oxide, and 1.2–5 vol. % of boron nitride.

* * * * *